United States Patent [19]

Wisbey

[11] 4,100,511
[45] Jul. 11, 1978

[54] DELAY LINE OSCILLATOR LOCKED TO A SELECTED FREQUENCY OF A CHIRP DELAY LINE

[75] Inventor: Philip Henry Wisbey, Colchester, England

[73] Assignee: The Marconi Company Limited, England

[21] Appl. No.: 799,085

[22] Filed: May 20, 1977

[30] Foreign Application Priority Data

May 28, 1976 [GB] United Kingdom ............... 22476/76

[51] Int. Cl.² ........................... H03B 3/06; H03B 5/32
[52] U.S. Cl. ................................ 331/107 A; 331/172; 331/179
[58] Field of Search .................. 331/1 R, 1 A, 107 A, 331/172, 173, 177 R, 179; 333/30 R, 72

[56] References Cited

U.S. PATENT DOCUMENTS

| 3,855,548 | 12/1974 | Nandi et al. ...................... 331/107 A |
| 3,921,093 | 11/1975 | Lewis ........................... 331/107 A X |
| 3,936,765 | 2/1976 | Lewis et al. ......................... 331/1 R |
| 3,990,021 | 11/1976 | Hartmann et al. .......... 331/107 A X |

*Primary Examiner* — Siegfried H. Grimm

[57] ABSTRACT

An oscillator uses a delay line in a feedback loop to determine its frequency of operation. As the loop is capable of sustaining oscillations at more than one frequency the desired frequency is generated by an auxiliary delay line and is gated into loop at the correct instant by gating circuitry C.

3 Claims, 4 Drawing Figures

DELAY LINE OSCILLATOR LOCKED TO A SELECTED FREQUENCY OF A CHIRP DELAY LINE

This invention relates to oscillators of the kind having a closed loop built around a delay line. Such oscillators can support oscillations at several frequencies, and it is often necessary to inject a signal into the oscillator to ensure that its oscillations build-up at the required frequency to the exclusion of other possible frequencies, but difficulties can arise in ensuring that the correct frequency is injected.

The present invention seeks to provide an oscillator in which an injection signal having a particular required frequency is used to lock the frequency of an oscillator.

According to this invention, a delay line oscillator arrangement includes a closed loop delay line oscillator, and a chirp delay line for producing a range of frequencies, means for locking the closed loop oscillator onto one of the frequencies produced by the chirp delay line, and control means arranged to produce timing signals derived from signals produced by the chirp delay line for gating said one of the frequencies produced by the chirp delay line to the delay line oscillator to determine its frequency of oscillation.

The timing signals may be derived from the envelope of discrete frequency bands produced by the chirp delay line, and which include said one frequency, or alternatively an auxiliary delay line can be incorporated into the chirp delay line to produce a sequence of pulses in synchronism with the frequencies produced by the chirp delay line, which in this case may consist of a continous spectrum of frequencies or of descrete frequency bands as before.

Figure 1:
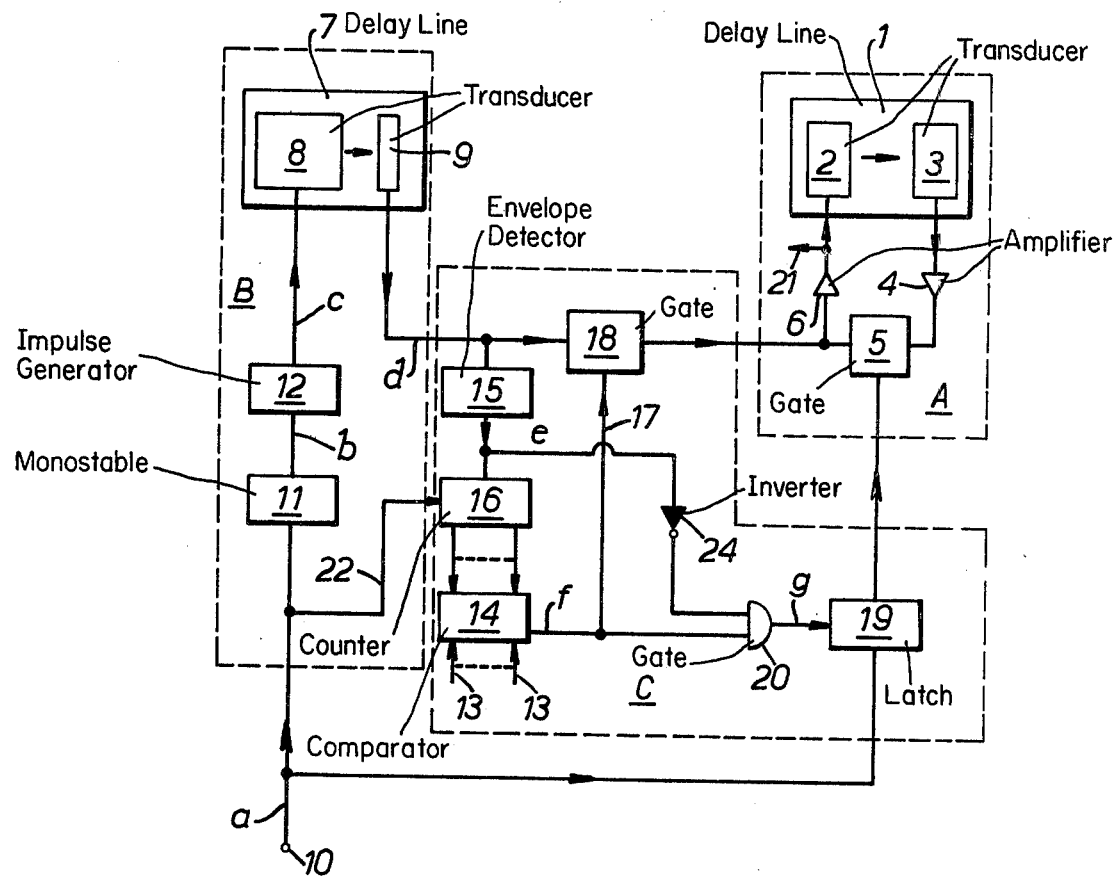
Figure 2:
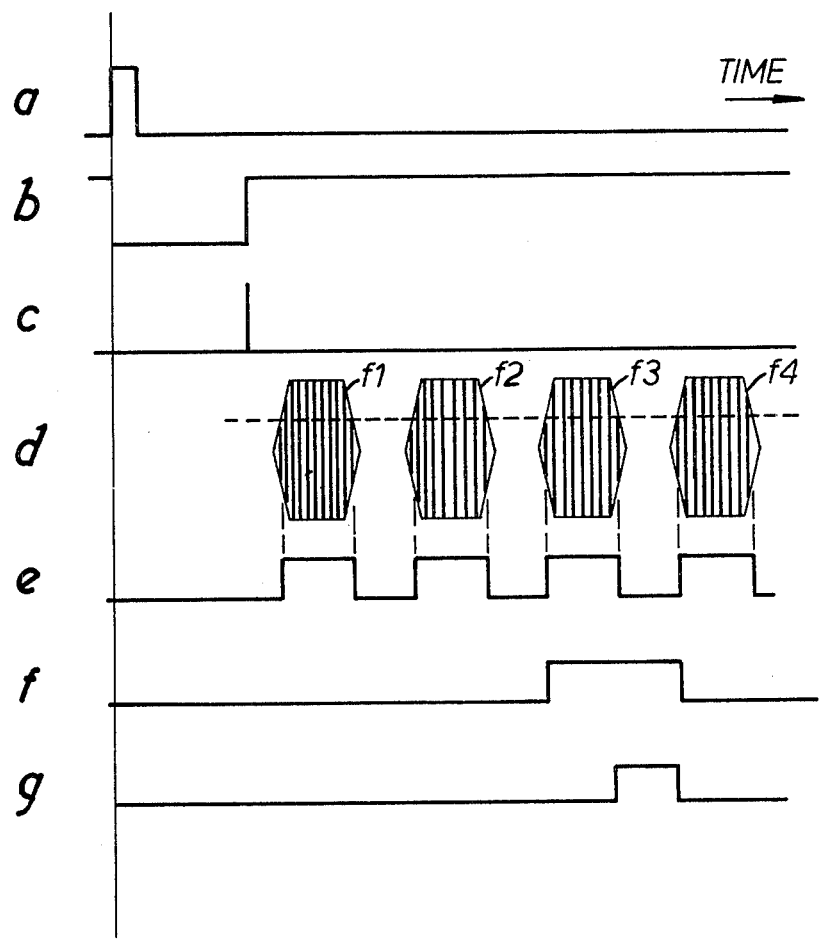
Figure 3:
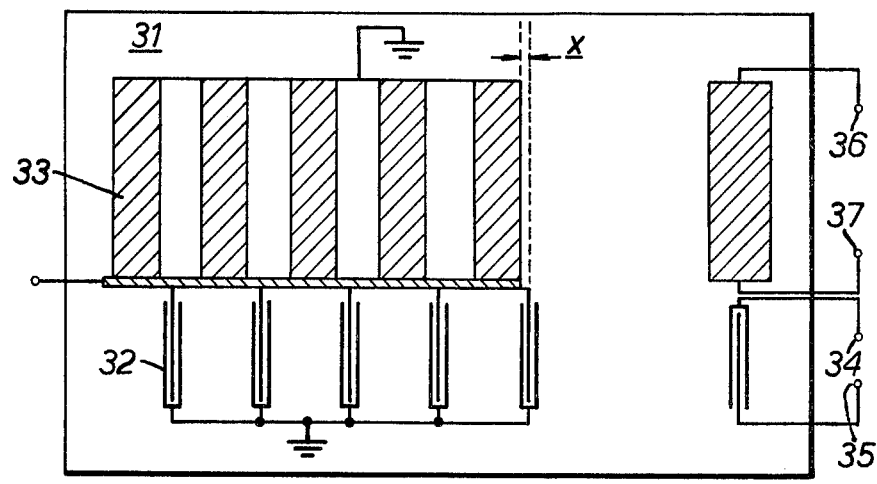
Figure 4:
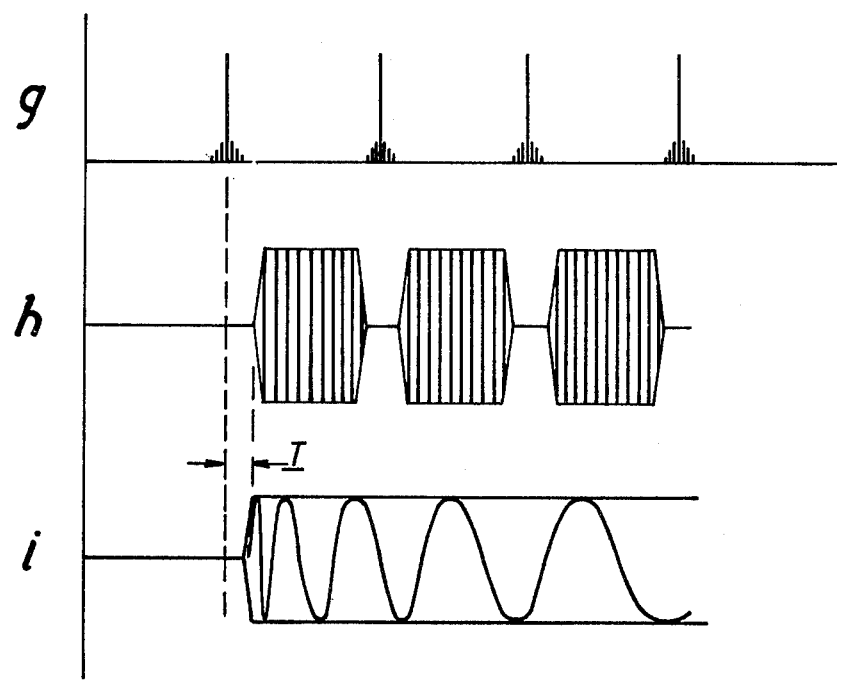

The invention is further described with reference to the accompanying drawings in which, FIG. 1 illustrates an oscillator in accordance with the present invention, FIG. 2 is an explanatory diagram, FIG. 3 shows an alternative arrangement for part of the oscillator shown in FIG. 1, and FIG. 4 is a further explanatory diagram relating to the alternative arrangement.

Referring to FIG. 1, the oscillator consists essentially of three main sections, shown as A, B and C, section A containing the delay line which during normal running produces the required output frequency, section B which produces an injection signal for triggering section A, and section C which is a timing circuit for ensuring that the correct injection signal is used to trigger the delay line.

The oscillator delay line 1 consists of a substrate, having transmit and received transducers 2 and 3 respectively. The output of the receive transducer 3 is connected via an amplifier 4, a gate 5, and a further amplifier 6 to the transmit transducer 2 to form a closed loop.

The transmit transducer 2 launches a surface acoustic wave which travels across the substrate relatively slowly to the receive transducer 3. As the closed loop can support oscillations at several closely related frequencies, a chirp delay line 7 is to produce a range of frequencies from which the required frequency can be selected. The chirp delay line 7 consists of a substrate which can propagate surface acoustic waves, and transmit and receive transducers 8 and 9 respectively. The transmit transducer 8 is provided with a spaced array of conductive fingers in well known manner such that a pulse applied to it produces a much longer output pulse at the receive transducer 9, the output pulse containing frequency components which increase from relatively low frequencies at the beginning of the pulse to much higher frequencies at the end of the pulse. By spacing the conductive fingers of the transmit transducer 8 in the correct manner discrete frequency bands are produced rather than a continuous spectrum of changing frequencies. Each discrete frequency band is arranged to include a frequency at which the oscillator delay line 1 will support oscillations.

The chirp delay line 7 is triggered when a "change frequency signal" is applied to an input terminal 10. This signal triggers a monostable 11 which produces a pulse of predetermined duration, at the end of which an impulse generator 12 produces a sharp spike to trigger the chirp delay line 7.

The new frequency required from the oscillator is entered in digital code form over lines 13 into a digital comparator 14. The chirp delay line 7 is arranged to produce, not a continuous frequency spectrum, but discrete bands of frequency F1 to F4 following each other in time as separate bursts. Each burst is detected by an envelope detector 15, and as each is detected one clock pulse is generated which is used to clock on an n-bit digital counter 16, and when the count in this counter is equal to the code entered in the comparator 14, a gating pulse is provided over line 17 to enable gate 18 which then passes the prevailing frequency burst to the oscillator delay line 1. Each trigger pulse applied to terminal 10 is also used to reset the counter 16 over reset line 22 to ensure that initially the counter is empty before clock pulses generated by the envelope detector 15 are fed to it.

The trigger pulse applied to terminal 10 is also routed to a latch 19 which inhibits gate 5, causing the oscillations present in the oscillator delay line to decay before the new frequency pulse is presented to it via gate 18. The required delay is produced by the monostable 11. When the gate 18 is enabled by the comparator 14, a pulse is also sent to an AND gate 20, which also receives pulses e via inverter 24. The output signal provided by the gate 20, which is shown at line g of FIG. 2 resets the latch 19 to remove the inhibit signal from gate 5, thereby completing the closed loop of the delay line oscillator 1. It is to be noted that the path through gate 5 is restored only when the complete frequency burst F3 has entered the oscillator delay line.

The various waveforms are shown in FIG. 2, and correspond to the points indicated on FIG. 1, and are thought to be largely self-explanatory in view of the preceding description of FIG. 1. The waveform d represents the frequency bursts produced by the chirp delay line 7 and consists, in this example, of four bursts of oscillations F1 to F4, each succeeding burst being of lower frequency than the previous one. It is assumed that the frequency code entered into the digital comparator is 3, and thus the frequency of the third frequency burst F3 is the one which is passed to the delay line oscillator 1, and which is maintained by the oscillator and presented at the output terminal 21.

A modified arrangement is shown in FIG. 3 in which a different form of chirp delay line 31 is used. It is provided with conductive fingers 33 arranged to produce an output frequency spectrum which can consist of discrete frequency bursts as before, or can be continuous. An auxiliary timing delay line 32 is incorporated onto the same substrate, and when triggered produces a sequence of sharp output pulses which are in step with the different output frequencies determined by the conductive fingers 33. The fingers 33 are directly connected to the auxiliary delay line 32 as shown to ensure that both are triggered simultaneously. Thus, by counting the timing pulses by feeding them directly from output terminals 34 and 35 to counter 16 of FIG. 1, gate 18 can be opened at the appropriate time to pass the correct frequency present at output terminals 36 and 37 to the delay line oscillator 1.

By displacing the auxiliary delay line by a small amount $x$ from the chirp delay line, an advance T can be produced so that gate 18 is fully enabled when the following frequency component or frequency band is available. The explanatory diagram in FIG. 4 shows the relationships between the timing pulses $g$, the discrete bands of frequencies $h$ and the continuous spectrum $i$ of falling frequencies, it being understood that $h$ and $i$ are alternatives, depending on the nature of the chirp delay line being used.

I claim:

1. A delay line oscillator arrangement including a closed loop delay line oscillator, and a chirp delay line for producing a range of frequencies, means for locking the closed loop oscillator onto one of the frequencies produced by the chirp delay line, and control means arranged to produce timing signals derived from signals produced by the chirp delay line for gating said one of the frequencies produced by the chirp delay line to the delay line oscillator to determine its frequency of oscillation.

2. An arrangement as claimed in claim 1 and wherein the timing signals are derived from the envelope of descrete frequency bands produced by the chirp delay line, and which includes said one frequency.

3. An arrangement as claimed in claim 1 and wherein an auxiliary delay line is incorporated into the chirp delay line to produce a sequence of pulses in synchronism with the frequencies produced by the chirp delay line.

* * * * *